(12) United States Patent
Wong et al.

(10) Patent No.: US 8,743,626 B2
(45) Date of Patent: Jun. 3, 2014

(54) CONTROLLING A NON-VOLATILE MEMORY

(75) Inventors: Yanyi L. Wong, Bellevue, WA (US); Troy N. Gilliland, Bellevue, WA (US)

(73) Assignee: Synopsys, Inc., Mountain View, CA (US)

( * ) Notice: Subject to any disclaimer, the term of this patent is extended or adjusted under 35 U.S.C. 154(b) by 135 days.

(21) Appl. No.: 13/030,156

(22) Filed: Feb. 18, 2011

(65) Prior Publication Data

US 2012/0213007 A1    Aug. 23, 2012

(51) Int. Cl.
*G11C 7/00*    (2006.01)

(52) U.S. Cl.
USPC ....................................... 365/189.09

(58) Field of Classification Search
USPC ....................................... 365/189.09
See application file for complete search history.

(56) References Cited

U.S. PATENT DOCUMENTS

| | | | | | |
|---|---|---|---|---|---|
| 4,958,317 | A | * | 9/1990 | Terada et al. | 365/185.02 |
| 5,538,914 | A | * | 7/1996 | Chiu et al. | 438/275 |
| 5,837,573 | A | * | 11/1998 | Guo | 438/238 |
| 7,961,546 | B2 | * | 6/2011 | Mair et al. | 365/227 |
| 2002/0102796 | A1 | * | 8/2002 | Lee et al. | 438/283 |
| 2009/0014792 | A1 | * | 1/2009 | Reynes et al. | 257/341 |
| 2010/0165735 | A1 | * | 7/2010 | Hashimoto | 365/185.18 |

* cited by examiner

*Primary Examiner* — Hoai V Ho
*Assistant Examiner* — Min Huang
(74) *Attorney, Agent, or Firm* — Baker Botts L.L.P.

(57) ABSTRACT

Controlling a non-volatile memory. The non-volatile memory includes a plurality of memory cells in an integrated circuit substrate. The non-volatile memory also includes a high-voltage node in power-transmissive communication with the plurality of memory cells. Further, the non-volatile memory includes an intermediate-voltage node in power-transmissive communication with the plurality of memory cells. Moreover, the non-volatile memory includes a counter-doped-gate device, coupled within the integrated circuit substrate, in power-transmissive communication between the high-voltage node and the intermediate-voltage node.

23 Claims, 5 Drawing Sheets

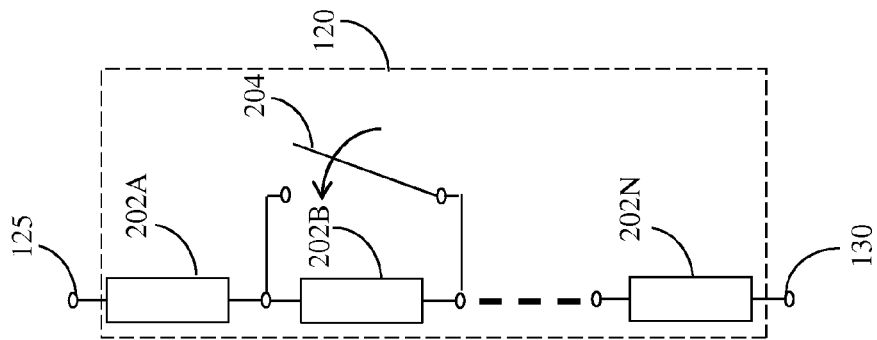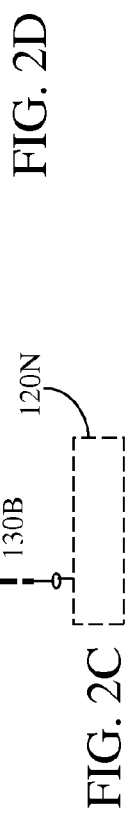

US 8,743,626 B2

CONTROLLING A NON-VOLATILE MEMORY

TECHNICAL FIELD

Embodiments of the disclosure relate to intermediate-voltage generation in a non-volatile memory.

BACKGROUND

A non-volatile memory is a memory that retains data when power is inactivated. Such a non-volatile memory, for example an Electrically Programmable Read Only Memory (EPROM) or an Electrically Erasable and Programmable Read Only Memory (EEPROM), requires electrical power at various voltages when performing read, program, erase and verify operations. A charge pump in the non-volatile memory generates the various voltages. The voltages that are generated are usually high voltages whereas there is a need for intermediate voltages that are not readily available. An intermediate-voltage generator can be used to generate the intermediate voltages. However, multiple devices, for example diodes and transistors, have to be used in the intermediate-voltage generator in order to generate the intermediate voltages. Usage of the multiple devices leads to inefficient use of silicon area.

Hence, there is a need for an intermediate-voltage generator that provides electrical power at an intermediate voltage to the non-volatile memory while using a minimal amount of silicon area.

SUMMARY

An example of a non-volatile memory includes a plurality of memory cells in an integrated circuit substrate. The non-volatile memory also includes a high-voltage node in power-transmissive communication with the plurality of memory cells. Further, the non-volatile memory includes an intermediate-voltage node in power-transmissive communication with the plurality of memory cells. Moreover, the non-volatile memory includes a counter-doped-gate device, coupled within the integrated circuit substrate, in power-transmissive communication between the high-voltage node and the intermediate-voltage node.

An example of a non-volatile memory includes a plurality of memory cells in an integrated circuit substrate. The non-volatile memory also includes a high-voltage node in power-transmissive communication with the plurality of memory cells. Further, the non-volatile memory includes an intermediate-voltage node in power-transmissive communication with the plurality of memory cells. Moreover, the non-volatile memory includes a plurality of counter-doped gate devices, coupled in series, in power-transmissive communication between the high-voltage node and the intermediate-voltage node.

An example of a method of controlling a non-volatile memory includes coupling a high-voltage node in the non-volatile memory to an intermediate-voltage node in the non-volatile memory through a first counter-doped-gate device in an integrated circuit substrate. The method also includes coupling the high-voltage node and the intermediate-voltage node to a plurality of memory cells through a plurality of addressable switches. Each addressable switch of the plurality of addressable switches is associated with a different one of the plurality of memory cells. Each addressable switch of the plurality of addressable switches couple the intermediate-voltage node to an associated memory cell when inactivated. Further, the method includes applying an address to the plurality of addressable switches. The address activates one addressable switch of the plurality of addressable switches and thereby causes the addressable switch to couple the high-voltage node to an associated memory cell.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

FIG. 2A illustrates an intermediate voltage generator, in accordance with one embodiment;

FIG. 2B illustrates an intermediate voltage generator, in accordance with another embodiment;

FIG. 2C illustrates a plurality of intermediate voltage generators, in accordance with one embodiment;

FIG. 2D illustrates an intermediate voltage generator, in accordance with yet another embodiment;

DETAILED DESCRIPTION OF THE EMBODIMENTS

Figure 1:
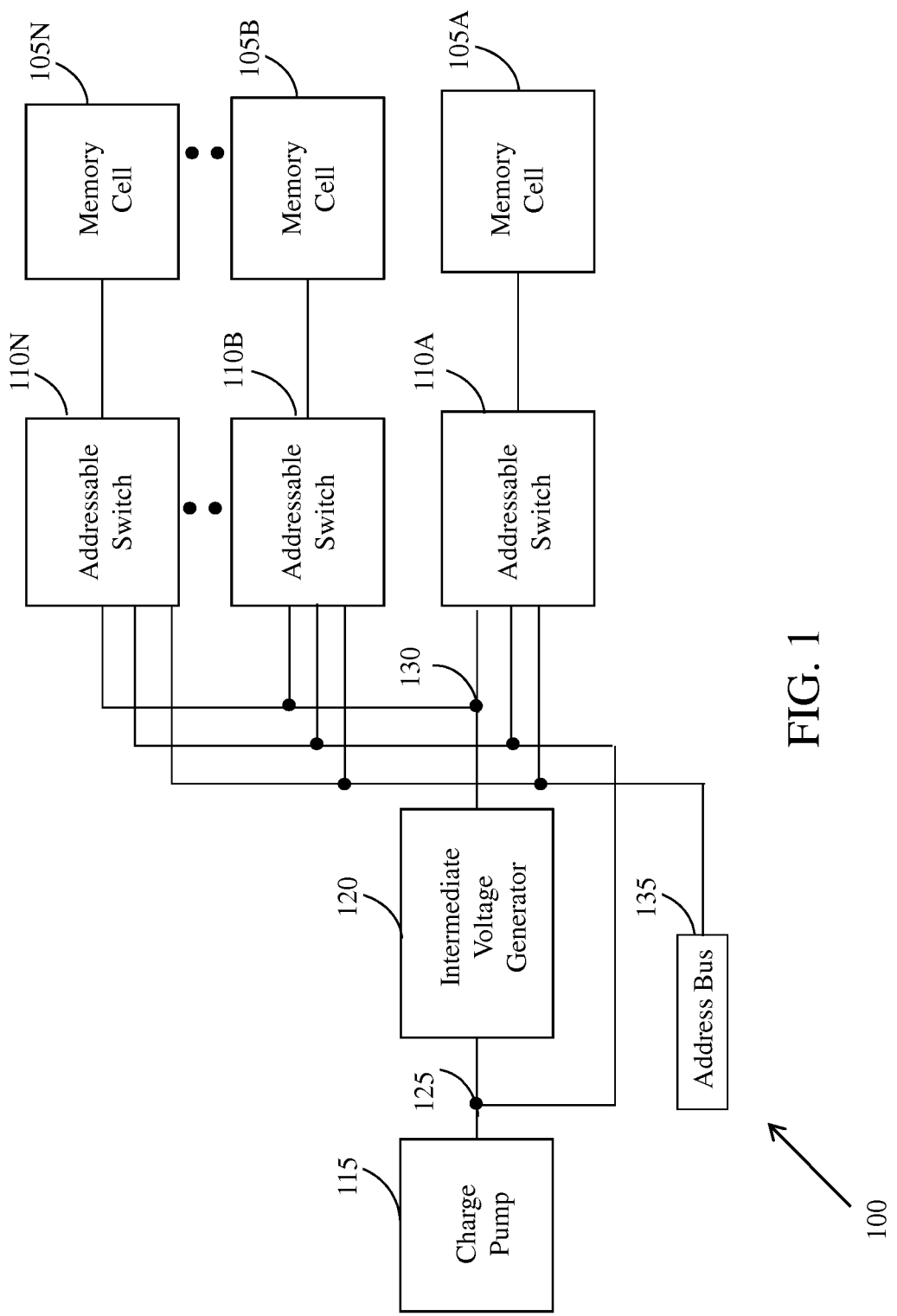
FIG. 1 illustrates a non-volatile memory, in accordance with one embodiment.

FIG. 1 illustrates a non-volatile memory 100, in accordance with one embodiment. The non-volatile memory 100 includes an integrated circuit substrate, for example a silicon substrate (not shown). The non-volatile memory 100 also includes a plurality of memory cells on the integrated circuit substrate, for example a memory cell 105A to a memory cell 105N. The memory cells are coupled to a plurality of addressable switches, for example an addressable switch 110A to an addressable switch 110N. Each memory cell, for example the memory cell 105A, is coupled to one addressable switch, for example the addressable switch 110A. Each addressable switch is further coupled to a charge pump 115 at a high-voltage node 125, to an intermediate-voltage generator 120 at an intermediate-voltage node 130, and to an address bus 135. The intermediate-voltage generator 120 is also coupled to the charge pump 115 at the high-voltage node 125.

The high-voltage node 125 and the intermediate-voltage node 130 are in power-transmissive communication with the memory cells. The charge pump 115 generates electrical power at a high voltage at the high-voltage node 125. The intermediate-voltage generator 120 generates electrical power at an intermediate voltage at the intermediate-voltage node 130 in response to the high-voltage power. The high-voltage power and the intermediate-voltage power together with inputs from the address bus 135 are provided as inputs to each addressable switch.

The intermediate-voltage generator 120 includes one or more counter-doped-gate devices on the integrated circuit substrate in a series connection. The counter-doped-gate devices are in power-transmissive communication between the high-voltage node 125 and the intermediate-voltage node 130. A voltage difference between the high-voltage node 125 and the intermediate-voltage node 130 can be determined according to threshold voltages of the counter-doped-gate devices.

In some embodiments, the high-voltage node 125 is coupled to the intermediate-voltage node 130 through a plurality of intermediate-voltage generators including the counter-doped-gate devices.

In some embodiments, the intermediate-voltage generator 120 is made to be adjustable by using a switch in controllable short-circuiting connection across one or more of the counter-doped-gate devices.

The intermediate-voltage generator 120 in different configurations is explained in conjunction with FIGS. 2A-2D.

FIG. 2A illustrates the intermediate voltage generator 120 including a single counter-doped-gate device 202. The counter-doped-gate device 202 is in power-transmissive communication between the high-voltage node 125 and the intermediate-voltage node 130.

FIG. 2B illustrates the intermediate voltage generator 120 including a plurality of counter-doped-gate devices, for example a counter-doped-gate device 202A to a counter-doped-gate device 202N, in a series connection. The counter-doped-gate devices are in power-transmissive communication between the high-voltage node 125 and the intermediate-voltage node 130.

FIG. 2C illustrates a plurality of intermediate voltage generators, for example an intermediate voltage generator 120A to an intermediate voltage generator 120N, coupled in a series connection. Each intermediate voltage generator includes one or more counter-doped-gate devices. The intermediate voltage generator 120A can include a counter-doped-gate device 202A1 to a counter-doped-gate device 202AN between the high-voltage node 125 and an intermediate-voltage node 130A. Similarly, the intermediate voltage generator 120B can include a counter-doped-gate device 202B1 to a counter-doped-gate device 202BN between the intermediate-voltage node 130A and an intermediate-voltage node 130B. The intermediate voltage generator 120A can generate a first level of the intermediate voltage, the intermediate voltage generator 120B can generate a second level of the intermediate voltage, and so on.

FIG. 2D illustrates the intermediate voltage generator 120 using one or more switches, for example a switch 204 in controllable short-circuiting connection across the counter-doped-gate device 202B. The intermediate voltage generator 120 includes a plurality of counter-doped-gate devices, for example the counter-doped-gate device 202A to the counter-doped-gate device 202N, in a series connection. The counter-doped-gate devices are coupled between the high-voltage node 125 and the intermediate-voltage node 130. The switches enable adjustment of the intermediate voltage generator 120 by shorting one or more of the counter-doped-gate devices. The switch 204, when closed, shorts anode and cathode of the counter-doped-gate device 202B, thereby resulting in a voltage drop from the high-voltage node 125 to the intermediate-voltage node 130. The intermediate voltage generator 120 is hence adjusted such that the intermediate voltage that is generated at the intermediate-voltage node 130 is at a desired level.

In some embodiments, the counter-doped-gate device 202, the counter-doped-gate device 202A to the counter-doped-gate device 202N, the counter-doped-gate device 202A1 to the counter-doped-gate device 202AN, the counter-doped-gate device 202B1 to the counter-doped-gate device 202BN and so on are identical p-type metal oxide semiconductor (PMOS) type transistors having similar threshold voltage.

In other embodiments, the counter-doped-gate device 202, the counter-doped-gate device 202A to the counter-doped-gate device 202N, the counter-doped-gate device 202A1 to the counter-doped-gate device 202AN, the counter-doped-gate device 202B1 to the counter-doped-gate device 202BN and so on are identical n-type metal oxide semiconductor (NMOS) type transistors having similar threshold voltage.

Figure 3:
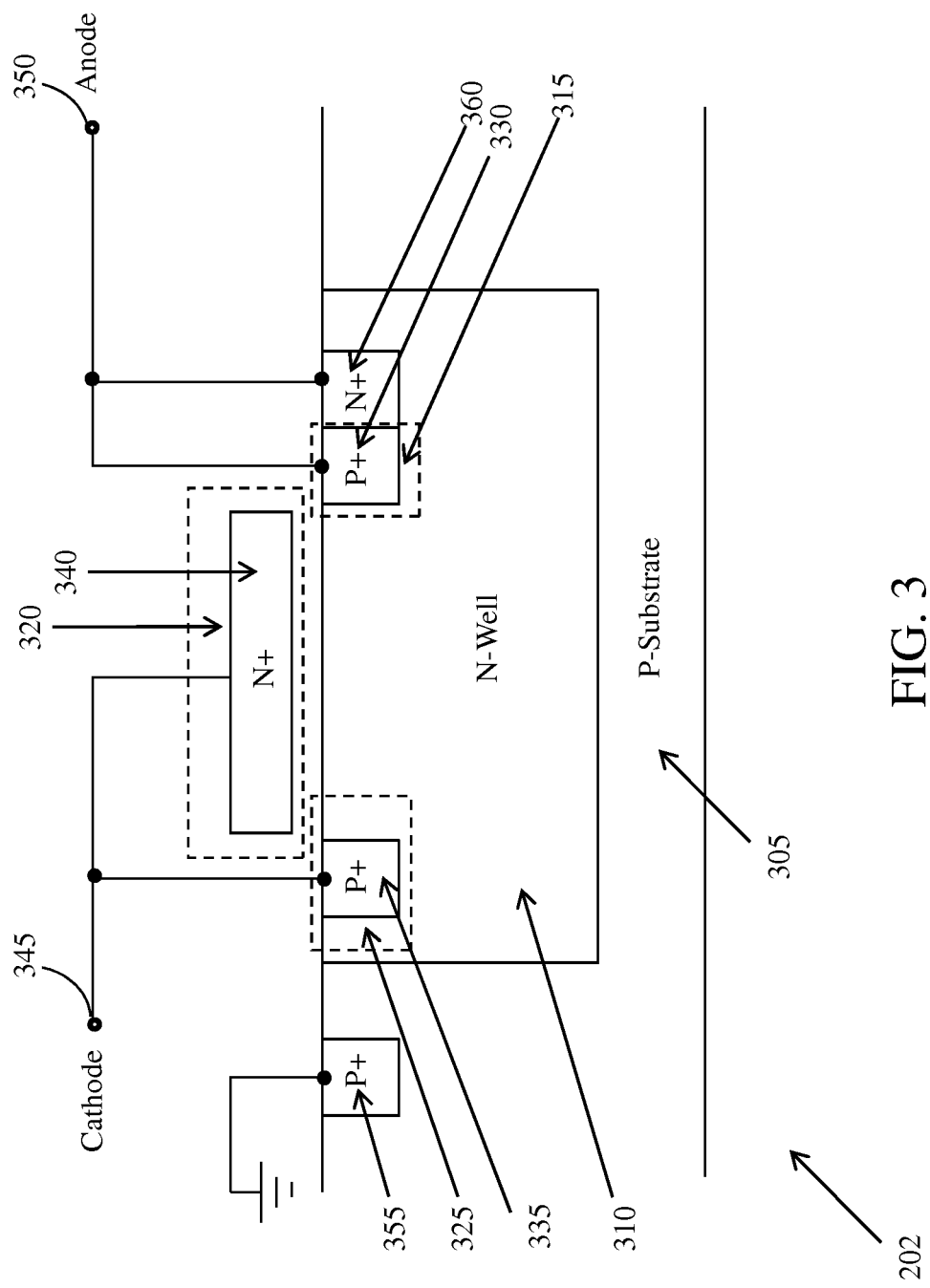
FIG. 3 is a cross-section diagram of a counter-doped-gate device, in accordance with one embodiment.

The counter-doped-gate device 202 in the intermediate-voltage generator 120 is explained in conjunction with FIG. 3.

FIG. 3 illustrates a counter-doped-gate device 202, in accordance with one embodiment.

Doping can be defined as a process whereby certain quantities are added to a semiconductor device such that electrical characteristics of the semiconductor device are modified. Counter-doping can hence be defined as a process whereby a p-type region is converted to an n-type region by adding a higher amount of n-type dopants as compared to amount of p-type dopants. Similarly, an n-type region can be converted to a p-type region by counter-doping the n-type region with p-type dopants. The counter-doping can be performed using plasma-doping. A doping process or a counter-doping process typically includes two steps of deposition and drive-in. The deposition can be defined as depositing of correct amount of dopant atoms to a region near wafer surface of the semiconductor device. In one example the deposition can be performed using ion implantation. The drive-in can be defined as redistribution of the dopant atoms. In one example the drive-in can be performed using diffusion.

A counter-doped-gate device can be defined as a device where gate of the device is doped with opposite type of dopants. For example, if gate of a PMOS device is generally doped with p-type dopants, the gate is to be doped with n-type dopants. In another embodiment, the counter-doped-gate device can be defined as the device where the gate of the device is first doped with one type of dopants and then doped with the opposite type of dopants. For example, the gate of the PMOS device is doped with p-type dopants and then doped with the n-type dopants.

The counter-doped-gate device 202 is a voltage drop device, for example a p-type metal oxide semiconductor field effect transistor (MOSFET), and can be fabricated using normal semiconductor complementary metal oxide semiconductor (CMOS) process. During fabrication, mask of gate of the counter-doped-gate device 202 has opposite type of dopants as compared to a regular MOSFET. The MOSFET is characterized by a threshold voltage of about 1.08 volts higher than threshold voltage of the regular MOSFET.

The counter-doped-gate device 202 is fabricated on a p-substrate 305. In one example, the p-substrate 305 can be a silicon substrate. An n-well 310 is formed on the p-substrate 305. The counter-doped-gate device 202 includes a source region 315, a gate region 320, and a drain region 325. The source region 315 defines a p-type source 330 and the drain region 325 defines a p-type drain 335. A p-channel (not shown) is formed between the p-type source 330 and the p-type drain 335. The gate region 320 includes a gate 340 of polysilicon that is doped with n-type dopants, for example phosphorous or arsenic, to form an n-type gate. In other embodiments, the gate 340 includes a p-type gate of polysilicon that is counter doped with the n-type dopants until the p-type gate becomes the n-type gate. The p-type drain 335 and the n-type gate are coupled together, defining a cathode 345. A p-type region 355, electrically connected to the p-substrate 305, is coupled to ground. Similarly, the source region 315 including the p-type source 330 defines an anode 350. In some embodiments, an n-type region 360, electrically connected to the n-well 310, is coupled to the anode 350. If anode-to-cathode voltage is above a certain threshold value, the p-channel forms and current flows from the p-type source 330 to the p-type drain 335. In the counter-doped-gate device 202, one purpose of counter doping the gate 340 is to save silicon area by increasing the threshold voltage and to enable generation of an intermediate voltage from a high voltage.

Applications of the counter-doped-gate device 202 include, but are not limited to, non-volatile memories, voltage reference generators, and current reference generators.

Figure 4:
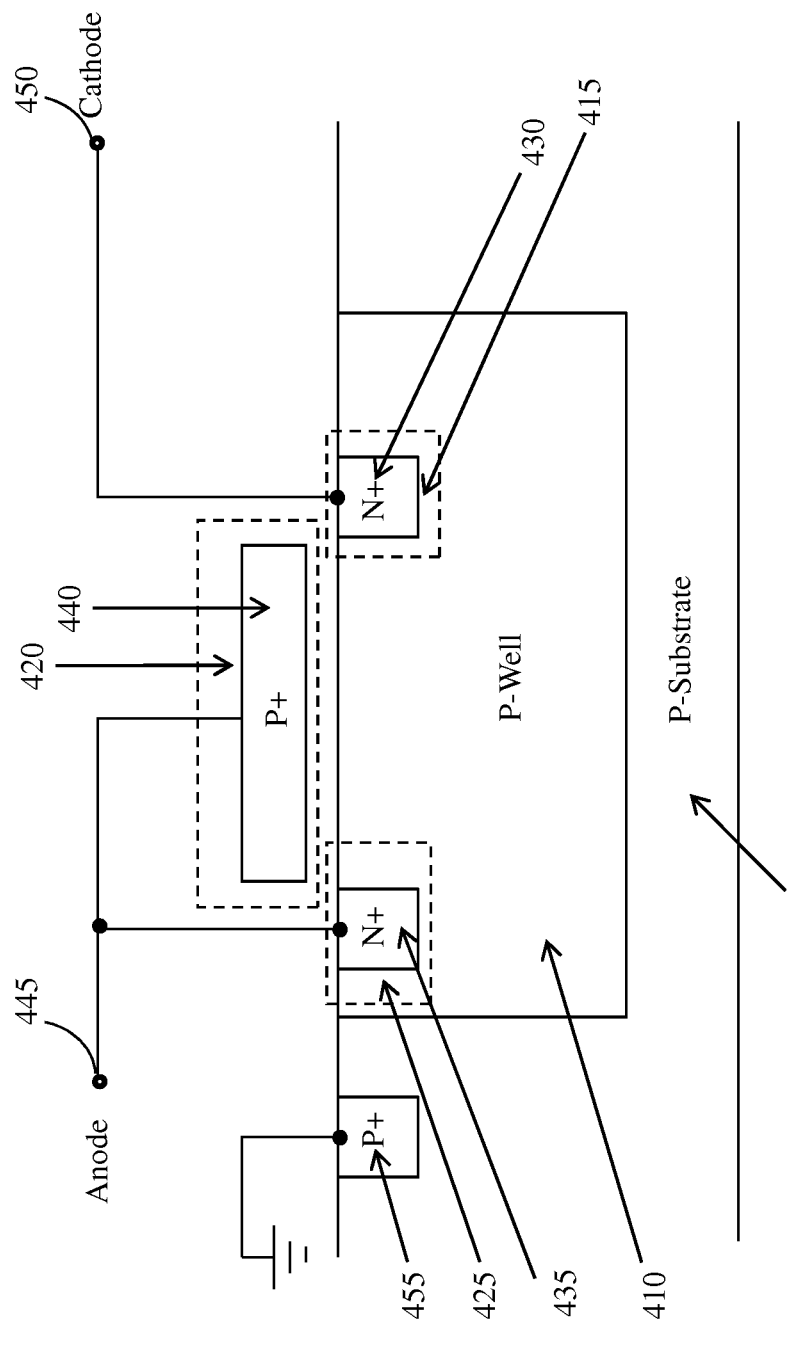
FIG. 4 is a cross-section diagram of a counter-doped-gate device in accordance with another embodiment.

FIG. 4 illustrates a counter-doped-gate device 202, in accordance with another embodiment.

The counter-doped-gate device 202, for example an n-type MOSFET, can be fabricated using a bulk semiconductor complementary metal oxide semiconductor (CMOS) process. The MOSFET is characterized by a threshold voltage of about 1.08 volts higher than threshold voltage of a regular MOSFET.

The counter-doped-gate device 202 is fabricated on a p-substrate 405. In one example, the p-substrate 405 can be a silicon substrate. A p-well 410 is formed on the p-substrate 405. The counter-doped-gate device 202 includes a source region 415, a gate region 420, and a drain region 425. The source region 415 defines an n-type source 430 and the drain region 425 defines an n-type drain 435. An n-channel (not shown) is formed between the n-type source 430 and the n-type drain 435. The gate region 420 includes a gate 440 of polysilicon that is doped with p-type dopants, for example boron or aluminium, to form a p-type gate. In other embodiments, the gate 440 includes an n-type gate of polysilicon that is counter doped with the p-type dopants until the n-type gate becomes the p-type gate. The n-type drain 435 and the p-type gate are coupled together, defining an anode 445. A p-type region 455, electrically connected to the p-substrate 405, is coupled to ground. Similarly, the source region 415 including the n-type source 430 defines a cathode 450. If anode-to-cathode voltage is above a certain threshold value, the n-channel forms and current flows from the n-type drain 435 to the n-type source 430. In the counter-doped-gate device 202, one purpose of counter doping the gate 440 is to save silicon area by increasing the threshold voltage and to enable generation of an intermediate voltage from a high voltage.

Figure 5:
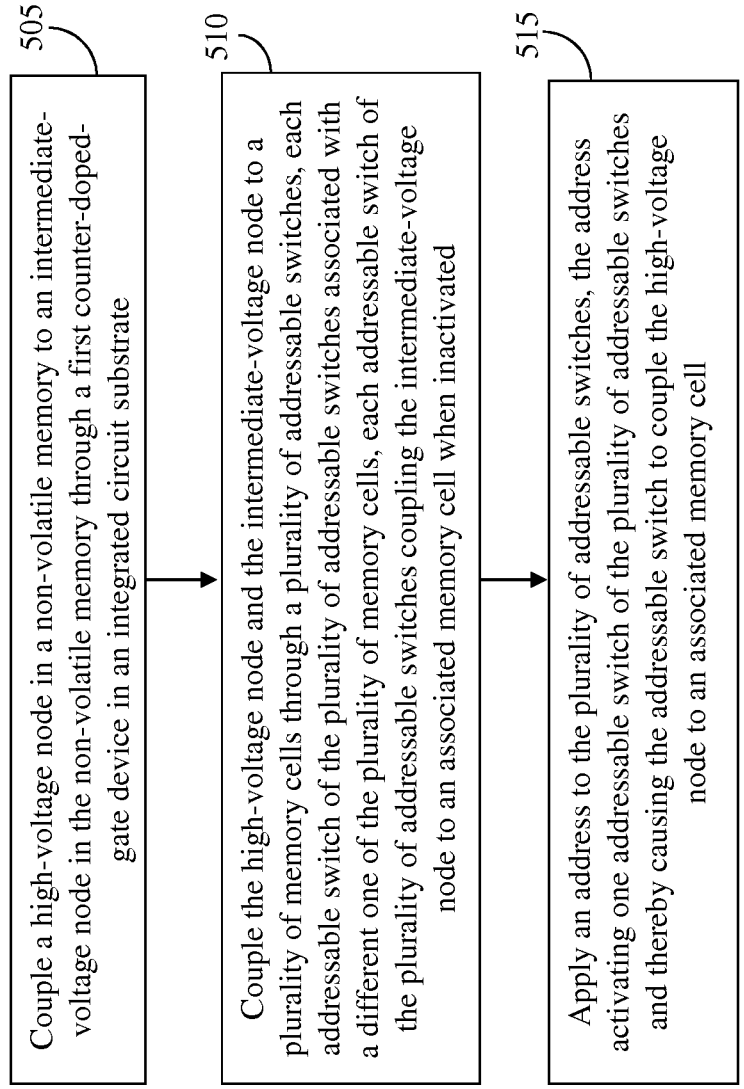
FIG. 5 is a flow diagram illustrating a method of controlling a non-volatile memory in accordance with one embodiment.

FIG. 5 is a flow diagram illustrating a method of controlling a non-volatile memory, for example the non-volatile memory 100.

At step 505, a high-voltage node in the non-volatile memory is coupled to an intermediate-voltage node in the non-volatile memory through a first counter-doped-gate device, hereinafter referred to as the counter-doped-gate device, in an integrated circuit substrate.

The non-volatile memory includes the integrated circuit substrate, for example silicon. The non-volatile memory also includes a charge pump, for example the charge pump 115, coupled to an intermediate-voltage generator, for example the intermediate-voltage generator 120. The charge pump is coupled to the intermediate-voltage generator at the high-voltage node, for example the high-voltage node 125. The intermediate-voltage node, for example the intermediate-voltage node 130, is coupled to the intermediate-voltage generator. The high-voltage node is hence coupled to the intermediate-voltage node through one or more counter-doped-gate devices, for example the counter-doped-gate device 202, which are included in the intermediate-voltage generator.

In some embodiments, the high-voltage node is coupled to the intermediate-voltage node through a plurality of intermediate-voltage generators that are coupled in a series connection. Each of the intermediate-voltage generators includes a plurality of counter-doped-gate devices coupled in a series connection.

In some embodiments, the intermediate-voltage generator is made to be adjustable by using a switch in controllable short-circuiting connection across one or more of the counter-doped-gate devices. Such adjustability reduces risks as post-manufacturing tuning ability is added.

A high voltage is generated by the charge pump at the high-voltage node. An intermediate voltage is generated by the intermediate-voltage generator at the intermediate-voltage node using the counter-doped-gate devices.

At step 510, the high-voltage node and the intermediate-voltage node are coupled to a plurality of memory cells, for example the memory cell 105A to the memory cell 105N, through a plurality of addressable switches, for example the addressable switch 110A to the addressable switch 110N. The memory cells are included in the integrated circuit substrate.

Each addressable switch, for example the addressable switch 110A, of the addressable switches is coupled to a different one of the memory cells, for example the memory cell 105A. Each addressable switch also couple the intermediate-voltage node to an associated memory cell when inactivated. Each addressable switch is further coupled to the charge pump, the intermediate-voltage generator, and an address bus, for example the address bus 135.

The high-voltage node and the intermediate-voltage node are in power-transmissive communication with the memory cells. Inputs from the address bus are also provided as inputs to each addressable switch.

At step 515, an address is applied to the addressable switches. The address activates one addressable switch of the addressable switches and thereby causes the addressable switch to couple the high-voltage node to an associated memory cell.

In one example, the address can be applied by the address bus 135 to the addressable switch 110A. Based on the address, the addressable switch 110A outputs the high voltage or the intermediate voltage to the memory cell 105A. If the memory cell 105A is to be selected, the high voltage is provided as input. If the addressable switch 110A is unselected and the addressable switch 110B is selected, the intermediate voltage is provided as input to the memory cell 105A.

The intermediate voltage is generated from the high voltage using the counter-doped-gate device. The counter-doped-gate device is a voltage drop device, for example a p-type metal oxide semiconductor field effect transistor (MOSFET), and can be fabricated using a semiconductor complementary metal oxide semiconductor (CMOS) process. Voltage across the high-voltage node and the intermediate-voltage node can be determined based on a threshold voltage of the counter-doped-gate device. The counter-doped-gate device is characterized by a threshold voltage of about 1.08 volts higher than a threshold voltage of a regular MOSFET. The 1.08 volts is a difference in threshold voltage between the counter-doped-gate device and the regular MOSFET, and can range between 0.98 volts and 1.18 volts depending on different processes.

The counter-doped-gate device is fabricated on a p-substrate, for example a silicon substrate. The counter-doped-gate device can include an n-well, a source region, a gate region, and a drain region. The drain region and the source region are formed in the n-well. In one embodiment, the drain region is formed by implanting or doping the n-well with p-type dopants. In one example, the p-type dopants can be boron.

The source region includes a p-type source, for example the p-type source 330, and the drain region includes a p-type drain, for example the p-type drain 335. A p-channel is formed between the p-type source and the p-type drain. The gate region includes a gate, for example the gate 340, which is an n-type gate of polysilicon. In some embodiments, the gate can be doped with p-type dopants and then subsequently doped with n-type dopants to form the n-type gate. The gate is doped with the n-type dopants to increase the threshold voltage of the counter-doped-gate device.

The counter-doped-gate device is a transistor diode having a cathode, for example the cathode 345, and an anode, for example the anode 350. The p-type drain and the n-type gate define the cathode. A p-type region, for example the p-type region 355, electrically connected to the p-substrate 305, is coupled to ground. Similarly, the source region including the p-type source defines the anode. In some embodiments, an n-type region, for example the n-type region 360, electrically connected to the n-well, for example the n-well 310, is coupled to the anode, for example the anode 350. If anode-to-cathode voltage is above a certain threshold value, the p-channel forms and current flows from the p-type source to the p-type drain.

In some embodiments, the counter-doped-gate device can be an n-type MOSFET.

The counter-doped-gate device is then fabricated on a p-type substrate. The counter-doped-gate device can include a p-well, a source region, a gate region, and a drain region. The drain region and the source region are formed in the p-type substrate. In one embodiment, the drain region is formed by implanting or doping the p-type substrate with n-type dopants. In one example, the n-type dopants can be phosphorus or arsenic.

The source region includes an n-type source, for example an n-type source 430, and the drain region includes an n-type drain, for example an n-type drain 435. An n-channel is formed between the n-type source and the n-type drain. The gate region includes a gate, for example the gate 440, which is a p-type gate of polysilicon. In some embodiments, the gate can be doped with n-type dopants and then doped with p-type dopants to form the p-type gate. The gate is doped with the p-type dopants to increase the threshold voltage of the counter-doped-gate device.

The counter-doped-gate device is a transistor diode having an anode, for example the anode 445, and a cathode, for example the cathode 450. The n-type drain and the p-type gate define the anode. A p-type region, for example the p-type region 455, electrically connected to the p-substrate, is coupled to ground. Similarly, the source region including the n-type source defines the cathode. If anode-to-cathode voltage is above a certain threshold value, the n-channel forms and current flows from the n-type drain to the n-type source.

One or more counter-doped-gate devices, for example the counter-doped-gate device 202, generates the intermediate voltage from the high voltage in order to build a high-voltage switching and distributing network for a non-volatile memory. The counter-doped-gate device 202 also reduces number of devices on the integrated circuit substrate thereby saving silicon area. Further, the intermediate voltage that is generated has increased accuracy as a bandgap voltage that is stable across process variations during manufacture.

In the foregoing discussion, the term "power-transmissive communication" refers to communication between two nodes or devices by transmission of power from one node or device to another.

In the foregoing discussion, the term "coupled or connected" refers to either a direct electrical connection between the devices connected or an indirect connection through intermediary devices.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description.

What is claimed is:

1. A device comprising:
    a plurality of non-volatile memory cells;
    a high-voltage node coupled to the plurality of memory cells;
    an intermediate-voltage node coupled to the plurality of memory cells; and
    a metal-oxide-semiconductor field-effect transistor (MOSFET) coupled between the high-voltage node and the intermediate-voltage node and configured to provide a voltage drop between the high-voltage node and the intermediate-voltage node, wherein:
    the MOSFET comprises a gate, source, and drain;
    the gate is fabricated by a counter-doping process, wherein the gate is doped with a first type of dopant and then doped with a second type of dopant, the second type of dopant being an opposite type of dopant compared to the first type of dopant;
    the source and drain are doped with a dopant having a same type as the first type of dopant;
    a proximate region located next to the source on a side opposite to the gate is doped with a dopant having a same type as the second type of dopant; and
    the MOSFET is configured as a device comprising a first terminal and a second terminal, wherein the first terminal comprises the gate electrically coupled to the drain, and wherein the second terminal comprises the source electrically coupled to the proximate region.

2. The device of claim 1, wherein the MOSFET is characterized by a threshold voltage of about 1.08 volts higher than a threshold voltage of a regular MOSFET.

3. The device of claim 1, wherein:
    the MOSFET is a p-type metal oxide semiconductor (PMOS) transistor;
    the gate is n+ doped;
    the first type of dopant is a p-type dopant;
    the second type of dopant is an n-type dopant;
    the first MOSFET terminal is a cathode; and
    the second MOSFET terminal is an anode.

4. The device of claim 1, wherein:
    the MOSFET is an n-type metal oxide semiconductor (NMOS) transistor;
    the gate is p+ doped;
    the first type of dopant is an n-type dopant;
    the second type of dopant is a p-type dopant;
    the first MOSFET terminal is an anode; and
    the second MOSFET terminal is a cathode.

5. The device of claim 1, wherein the MOSFET is further configured to operate as an intermediate-voltage generator, the intermediate-voltage generator providing electrical power to the intermediate-voltage node at an intermediate voltage.

6. The device of claim 1, further comprising a charge pump that generates a high voltage at the high-voltage node.

7. The of claim 1, further comprising a plurality of addressable switches, each addressable switch of the plurality of addressable switches connected between a different memory cell of the plurality of memory cells and the high voltage and intermediate-voltage nodes.

8. A device comprising:
a plurality of non-volatile memory cells;
a high-voltage node coupled to the plurality of memory cells;
an intermediate-voltage node coupled to the plurality of memory cells; and
a plurality of metal-oxide-semiconductor field-effect transistors (MOSFETs) coupled in series between the high-voltage node and the intermediate-voltage node and configured to provide a voltage drop between the high-voltage node and the intermediate-voltage node, wherein:
  each MOSFET comprises a gate, source, and drain;
  the gate of each MOSFET is fabricated by a counter-doping process, wherein the gate is doped with a first type of dopant and then doped with a second type of dopant, the second type of dopant being an opposite type of dopant compared to the first type of dopant;
  the source and drain of each MOSFET are doped with a dopant having a same type as the first type of dopant;
  a proximate region located next to the source on a side opposite to the gate of each MOSFET is doped with a dopant having a same type as the second type of dopant;
  each MOSFET is configured as a device comprising a first terminal and a second terminal, wherein the first terminal comprises the gate of each MOSFET electrically coupled to the drain of each MOSFET, and wherein the second terminal comprises the source of each MOSFET electrically coupled to the proximate region of each MOSFET; and
  the plurality of MOSFETs are coupled to one another in series so that a first terminal of a MOSFET of the plurality of MOSFETs is coupled to a second terminal of another MOSFET of the plurality of MOSFETs.

9. The device of claim 8, further comprising a switch in controllable short-circuiting connection across one or more of the plurality of MOSFETs.

10. The device of claim 8, wherein:
one or more first MOSFETs of the plurality of MOSFETs are configured to operate as a first intermediate-voltage generator; and
one or more second MOSFETs of the plurality of MOSFETs are configured to operate as a second intermediate-voltage generator.

11. The device of claim 10, further comprising:
a first switch in controllable short-circuiting connection across one or more of the MOSFETs of the first intermediate-voltage generator; and
a second switch in controllable short-circuiting connection across one or more of the MOSFETs of the second intermediate-voltage generator.

12. A method of controlling a non-volatile memory, the method comprising:
coupling a high-voltage node in the non-volatile memory to an intermediate-voltage node in the non-volatile memory through a first metal-oxide-semiconductor field-effect transistor (MOSFET) configured to provide a voltage drop between the high-voltage node and the intermediate-voltage node, wherein:
  the first MOSFET comprises a gate, source, and drain;
  the gate is fabricated by a counter-doping process, wherein the gate is doped with a first type of dopant and then doped with a second type of dopant, the second type of dopant being an opposite type of dopant compared to the first type of dopant;
  the source and drain are doped with a dopant having a same type as the first type of dopant;
  a proximate region located next to the source on a side opposite to the gate is doped with a dopant having a same type as the second type of dopant; and
  the first MOSFET is configured as a device comprising a first terminal and a second terminal, wherein the first terminal comprises the gate electrically coupled to the drain, and wherein the second terminal comprises the source electrically coupled to the proximate region;
coupling the high-voltage node and the intermediate-voltage node to a plurality of memory cells through a plurality of addressable switches, each addressable switch of the plurality of addressable switches associated with a different one of the plurality of memory cells, each addressable switch of the plurality of addressable switches coupling the intermediate-voltage node to an associated memory cell when inactivated; and
applying an address to the plurality of addressable switches, the address activating one addressable switch of the plurality of addressable switches and thereby causing the addressable switch to couple the high-voltage node to an associated memory cell.

13. The method of claim 12, further comprising generating a high voltage at the high-voltage node.

14. The method of claim 13, further comprising providing the high voltage to the associated memory cell of the addressable switch through the high-voltage node if the address activates the addressable switch.

15. The method of claim 12, further comprising generating an intermediate voltage at the intermediate-voltage node.

16. The method of claim 15, further comprising providing the intermediate voltage to the associated memory cell of the addressable switch through the intermediate-voltage node if the address inactivates the addressable switch.

17. The method of claim 13, wherein the high voltage is generated by a charge pump.

18. The method of claim 15, wherein the intermediate voltage is generated by a first intermediate-voltage generator.

19. The method of claim 12, wherein the first MOSFET is characterized by a threshold voltage of about 1.08 volts higher than threshold voltage of a regular MOSFET.

20. The method of claim 12, wherein:
the first MOSFET is a p-type metal oxide semiconductor (PMOS) transistor;
the gate is n+ doped;
the first type of dopant is a p-type dopant;
the second type of dopant is an n-type dopant;
the first MOSFET terminal is a cathode; and
the second MOSFET terminal is an anode.

21. The method of claim 12, wherein:
the first MOSFET is an n-type metal oxide semiconductor (NMOS) transistor;
the gate is p+ doped;
the first type of dopant is an n-type dopant;
the second type of dopant is a p-type dopant;
the first MOSFET terminal is an anode; and
the second MOSFET terminal is a cathode.

22. The method of claim 18, wherein the first intermediate-voltage generator comprises one or more MOSFETs in series with the first MOSFET, wherein the one or more MOSFETs are fabricated with substantially a same counter-doping process as the first MOSFET.

23. The method of claim 22, further comprising coupling one or more additional intermediate-voltage generators in a series connection with the first intermediate-voltage generator between the high-voltage node and the intermediate-voltage node.

\* \* \* \* \*